United States Patent
Hsu et al.

(10) Patent No.: US 10,795,255 B2
(45) Date of Patent: Oct. 6, 2020

(54) METHOD OF FORMING LAYOUT DEFINITION OF SEMICONDUCTOR DEVICE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Wei-Lun Hsu, Kaohsiung (TW); Gang-Yi Lin, Taitung County (TW); Yu-Hsiang Hung, Tainan (TW); Ying-Chih Lin, Tainan (TW); Feng-Yi Chang, Tainan (TW); Ming-Te Wei, Changhua County (TW); Shih-Fang Tzou, Tainan (TW); Fu-Che Lee, Taichung (TW); Chia-Liang Liao, Yunlin County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/175,858

(22) Filed: Oct. 31, 2018

(65) Prior Publication Data
US 2020/0105764 A1    Apr. 2, 2020

(30) Foreign Application Priority Data
Sep. 27, 2018  (CN) .......................... 2018 1 1130141

(51) Int. Cl.
*G03F 1/36*       (2012.01)
*H01L 23/538*     (2006.01)
(Continued)

(52) U.S. Cl.
CPC ................ *G03F 1/36* (2013.01); *G03F 1/144* (2013.01); *G03F 1/38* (2013.01); *G03F 7/0035* (2013.01);
(Continued)

(58) Field of Classification Search
CPC ............. H01L 21/0337; H01L 21/3086; H01L 21/76892; H01L 27/0207; H01L 27/10894;
(Continued)

(56) References Cited

U.S. PATENT DOCUMENTS 5,326,659 A * 7/1994 Liu ........................... G03F 1/26
430/320
5,879,844 A * 3/1999 Yamamoto ................ G03F 1/36
430/296
(Continued)

OTHER PUBLICATIONS

Chang, Title of Invention: Layout of Semiconductor Structure, Semiconductor Device and Method of Forming the Same, U.S. Appl. No. 15/857,642, filed Dec. 29, 2017.

*Primary Examiner* — Sophia T Nguyen
(74) *Attorney, Agent, or Firm* — Winston Hsu (57) ABSTRACT

A method of forming a layout definition of a semiconductor device includes the following steps. Firstly, a plurality of first patterns is established to form a material layer over a substrate, with the first patterns being regularly arranged in a plurality of columns along a first direction to form an array arrangement. Next, a plurality of second patterns is established to surround the first patterns. Then, a third pattern is established to form a blocking layer on the material layer, with the third pattern being overlapped with a portion of the second patterns and with at least one of the second patterns being partially exposed from the third pattern. Finally, the first patterns are used to form a plurality of first openings in (Continued)

a stacked structure on the substrate to expose a portion of the substrate respectively.

14 Claims, 5 Drawing Sheets

(51) Int. Cl.
    *G03F 1/38*     (2012.01)
    *H01L 21/033*     (2006.01)
    *H01L 21/308*     (2006.01)
    *G03F 1/00*     (2012.01)
    *G03F 7/20*     (2006.01)
    *G03F 7/00*     (2006.01)
    *H01L 27/108*     (2006.01)
(52) U.S. Cl.
    CPC ...... *G03F 7/70433* (2013.01); *G03F 7/70441* (2013.01); *H01L 21/0337* (2013.01); *H01L 21/3086* (2013.01); *H01L 23/5386* (2013.01); *H01L 27/10844* (2013.01); *H01L 27/10894* (2013.01); *H01L 27/10823* (2013.01); *H01L 27/10864* (2013.01)
(58) Field of Classification Search
    CPC ............ H01L 27/10864; H01L 23/544; G03F 7/70633; G03F 7/0035; G03F 7/70625; G03F 7/70683; G03F 7/70441; G03F 7/70433; G03F 1/36; G03F 1/144; G03F 1/38
    See application file for complete search history.

(56) References Cited

U.S. PATENT DOCUMENTS

| | | | | |
|---|---|---|---|---|
| 5,902,703 | A * | 5/1999 | Leroux | G03F 7/70441 356/614 |
| 5,962,173 | A * | 10/1999 | Leroux | G03F 7/70441 356/620 |
| 6,204,184 | B1 * | 3/2001 | Nishida | H01L 21/76229 438/692 |
| 6,225,025 | B1 * | 5/2001 | Hoshino | B82Y 10/00 430/296 |
| 6,229,172 | B1 * | 5/2001 | Kobayashi | H01L 27/10894 257/298 |
| 6,355,382 | B1 * | 3/2002 | Yasuzato | G03F 1/26 430/5 |
| 7,214,453 | B2 * | 5/2007 | Yamazoe | G03F 7/70433 430/5 |
| 7,767,570 | B2 | 8/2010 | Chen | |
| 8,293,456 | B2 * | 10/2012 | Fukuhara | G03F 1/00 430/311 |
| 8,372,748 | B2 * | 2/2013 | Park | H01L 21/283 257/208 |
| 8,597,860 | B2 * | 12/2013 | Tsai | G06F 17/5072 430/5 |
| 9,054,113 | B1 * | 6/2015 | Zhou | H01L 23/544 |
| 9,679,901 | B1 * | 6/2017 | Wang | H01L 21/762 |
| 10,199,359 | B1 * | 2/2019 | Sakakibara | H01L 25/0657 |
| 10,409,152 | B2 * | 9/2019 | Wallace | G03F 1/70 |
| 2002/0004714 | A1 * | 1/2002 | Jones | G03F 1/36 703/13 |
| 2002/0045106 | A1 * | 4/2002 | Baselmans | G03F 7/70433 430/5 |
| 2002/0045134 | A1 * | 4/2002 | Inoue | G03F 1/32 430/311 |
| 2004/0238900 | A1 * | 12/2004 | Yamada | H01L 27/0207 257/401 |
| 2005/0136340 | A1 * | 6/2005 | Baselmans | G03F 7/70433 430/5 |
| 2005/0142454 | A1 * | 6/2005 | Fujimoto | G03F 7/70433 430/5 |
| 2007/0174807 | A1 * | 7/2007 | Kumashiro | G03F 7/70433 716/52 |
| 2007/0218673 | A1 * | 9/2007 | Nakamura | G03F 1/36 438/597 |
| 2007/0249170 | A1 * | 10/2007 | Kewley | H01L 21/0337 438/706 |
| 2008/0032437 | A1 * | 2/2008 | Sugimoto | G03F 1/36 438/57 |
| 2008/0063988 | A1 * | 3/2008 | Fukuhara | G03F 7/213 430/327 |
| 2008/0241734 | A1 * | 10/2008 | Liu | H01L 21/0334 430/253 |
| 2009/0155715 | A1 * | 6/2009 | Chen | G03F 7/0035 430/270.1 |
| 2009/0203224 | A1 * | 8/2009 | Shih | G03F 7/0035 438/780 |
| 2009/0208886 | A1 * | 8/2009 | Takemura | G03F 7/0035 430/326 |
| 2009/0244502 | A1 * | 10/2009 | Kuechler | G03F 1/36 355/30 |
| 2009/0317749 | A1 * | 12/2009 | Lee | G03F 1/144 430/319 |
| 2010/0017779 | A1 * | 1/2010 | Kim | G03F 1/36 716/55 |
| 2010/0209825 | A1 * | 8/2010 | Choi | G03F 1/36 430/5 |
| 2010/0279505 | A1 * | 11/2010 | Yang | G03F 7/0035 438/689 |
| 2011/0159663 | A1 * | 6/2011 | Kang | H01L 21/3081 438/421 |
| 2011/0223541 | A1 * | 9/2011 | Lee | H01L 21/0273 430/314 |
| 2011/0294045 | A1 * | 12/2011 | Nagai | G03F 1/38 430/5 |
| 2012/0142194 | A1 * | 6/2012 | Hwang | H01L 21/0337 438/703 |
| 2013/0095663 | A1 * | 4/2013 | Seo | H01L 21/0337 438/696 |
| 2013/0323627 | A1 * | 12/2013 | Wang | G03F 1/00 430/5 |
| 2014/0091430 | A1 * | 4/2014 | Nagai | H01L 27/105 257/532 |
| 2014/0117488 | A1 * | 5/2014 | Wallace | H01L 21/0273 257/499 |
| 2014/0206162 | A1 * | 7/2014 | Eguchi | H01L 29/66712 438/268 |
| 2015/0171008 | A1 | 6/2015 | Luo | |
| 2015/0227671 | A1 * | 8/2015 | Yu | G06F 17/5081 716/52 |
| 2015/0294058 | A1 * | 10/2015 | Liou | H01L 23/544 438/703 |
| 2015/0325588 | A1 * | 11/2015 | Lee | H01L 27/11573 257/329 |
| 2016/0042965 | A1 * | 2/2016 | Ha | H01L 21/0271 438/702 |
| 2016/0195812 | A1 | 7/2016 | Huang | |
| 2016/0254153 | A1 * | 9/2016 | Park | H01L 21/0338 438/695 |
| 2016/0260632 | A1 * | 9/2016 | Kang | H01L 21/31144 |
| 2016/0293442 | A1 * | 10/2016 | Ban | H01L 21/31144 |
| 2016/0334208 | A1 * | 11/2016 | Liou | G03F 7/70633 |
| 2016/0336193 | A1 * | 11/2016 | Park | H01L 21/31144 |
| 2017/0053802 | A1 * | 2/2017 | Park | H01L 21/31144 |
| 2017/0053920 | A1 * | 2/2017 | Kim | H01L 27/10894 |
| 2017/0069726 | A1 * | 3/2017 | Kye | H01L 29/401 |
| 2017/0125300 | A1 * | 5/2017 | Kim | H01L 21/823431 |
| 2017/0139318 | A1 * | 5/2017 | Wallace | G03F 1/36 |
| 2017/0148643 | A1 * | 5/2017 | Ham | H01L 21/3086 |
| 2017/0243871 | A1 * | 8/2017 | Chun | H01L 27/10885 |
| 2018/0158827 | A1 * | 6/2018 | You | H01L 27/10876 |
| 2018/0240798 | A1 * | 8/2018 | Yang | H01L 27/088 |
| 2018/0247005 | A1 * | 8/2018 | Sun | G06F 17/5072 |
| 2018/0341172 | A1 * | 11/2018 | Kim | G03F 1/32 |
| 2018/0342519 | A1 * | 11/2018 | Kim | H01L 27/10855 |
| 2018/0374702 | A1 * | 12/2018 | Chang | H01L 21/0337 |
| 2019/0013201 | A1 * | 1/2019 | Chang | H01L 27/10855 |
| 2019/0035631 | A1 * | 1/2019 | Chang | H01L 21/0338 |

(56) References Cited

U.S. PATENT DOCUMENTS

2019/0057939 A1* 2/2019 Tobashi .................... G03F 1/42
2019/0172831 A1* 6/2019 Chang ............... H01L 27/10855
2019/0317393 A1* 10/2019 Sun ..................... G06F 17/5068
2019/0318929 A1* 10/2019 Chuang ............... H01L 21/0338

* cited by examiner

METHOD OF FORMING LAYOUT DEFINITION OF SEMICONDUCTOR DEVICE

BACKGROUND OF THE INVENTION

1. Field of the Invention

The present invention generally relates to the field of a method of forming layout definition of a semiconductor device, and more particularly to a method of forming layout definition of a dynamic random access memory (DRAM) device.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include a transistor device and a charge storage device, which is able to accept signals from a bit line and a word line during the operation. However, due to limitations in fabrication technologies, many defects are formed in the DRAM cell with the buried gate. Therefore, there is still a need to provide an improved memory cell with a buried gate to gain enhanced performance and reliability of the corresponding memory device.

SUMMARY OF THE INVENTION

One object of the present invention is to provide a method of forming a layout definition of a semiconductor device, in which, a layout design of a semiconductor device is firstly established to imitate the corresponding relationship between each element pattern, followed by forming practical structures on the semiconductor device accordingly. Thus, the method of the present invention enables to form minimized elements with a finer line width and space, so as to avoid possible limits which are subject to optical characteristics during the exposure process.

To achieve the purpose described above, the present invention provides a method of forming a layout definition of a semiconductor device including the following steps. First of all, a plurality of first patterns is established to form a material layer over a substrate, the first patterns are regularly arranged in a plurality of columns along a first direction to form an array arrangement. Then, a plurality of second patterns is established to surround the first patterns. Next, a third pattern is established to form a blocking layer on the material layer, with the third pattern being overlapped with a portion of the second patterns, with at least one of the second patterns being partially exposed from the third pattern. Finally, the first patterns are used to form a plurality of first openings in a stacked structure on the substrate to expose a portion of the substrate respectively.

In summary, the method of forming a layout definition of a semiconductor device of the present invention utilizes a layout design of photomask to establish an opening pattern of a semiconductor device and another opening pattern of a blocking layer respectively, to simultaneously defining a semiconductor structure in a compact, more condensed layout, and to further define a core region and a periphery region of the semiconductor device. In this way, the method of the present invention may have advantages to form an improve semiconductor device such as a dynamic random access memory (DRAM) device under a simplified process flow, for example forming a storage node (SN) of the DRAM device.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a layout definition of a semiconductor device according to a first preferred embodiment of the present invention, in which:

DETAILED DESCRIPTION

To provide a better understanding of the present invention, preferred embodiments will be described in detail. The preferred embodiments of the present invention are illustrated in the accompanying drawings with numbered elements.

Referring to FIGS. 1-5, FIGS. 1-5 illustrate a method of forming a layout definition of a semiconductor device according to the first preferred embodiment of the present invention. In the present embodiment, the method is for example used in a semiconductor process such as a dynamic random access memory (DRAM) device process, to form a semiconductor structure such as a storage node (SN) of the DRAM device, but is not limited thereto. Please refer to FIGS. 2-3, which shows a top view and a cross-sectional view respectively of a semiconductor structure formed in the present embodiment, and the semiconductor structure includes a plurality of first opening patterns 311, a plurality of second opening patterns 312 and a third opening pattern 331. In the present embodiment, the first opening patterns 311 and the second opening patterns 312 are formed in a same material layer 310, and the third opening pattern 331 is formed in a blocking layer 330 disposed over the material layer 310, but is not limited thereto.

Figure 1:
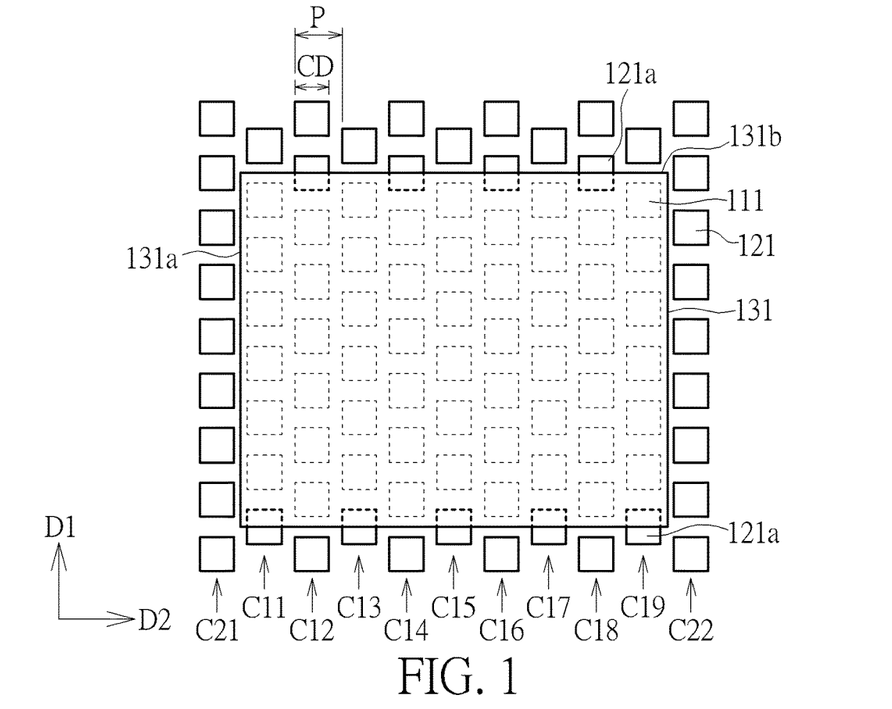
FIG. 1 shows a layout design of a semiconductor device formed accordingly.
Figure 2:
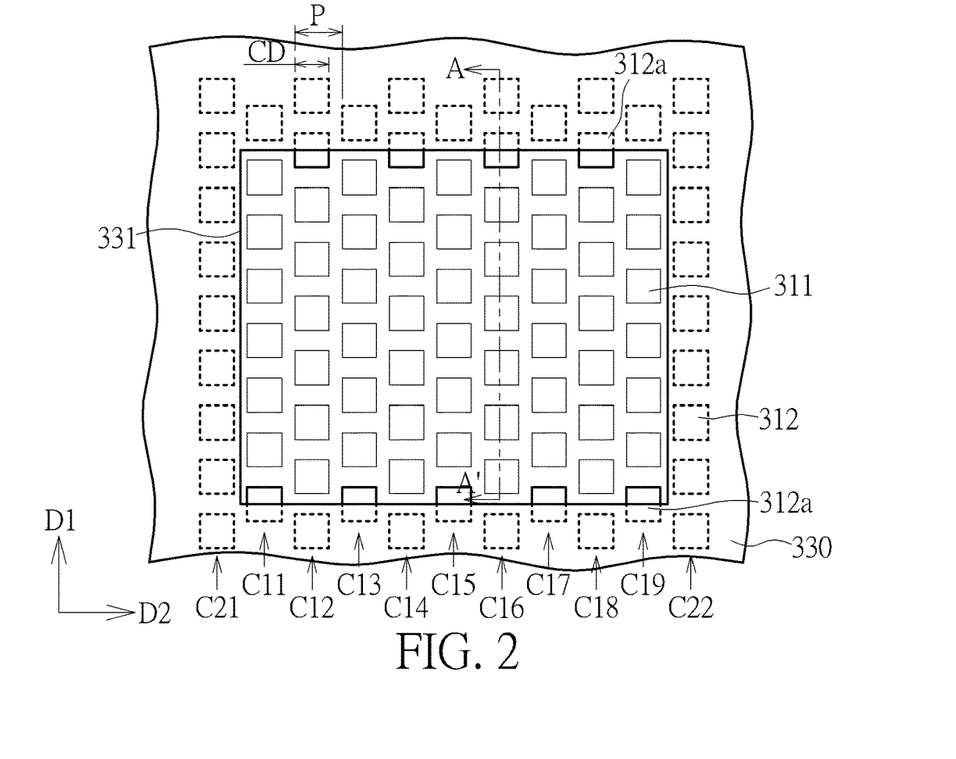
FIG. 2 shows a top view of a semiconductor structure formed accordingly.
Figure 3:
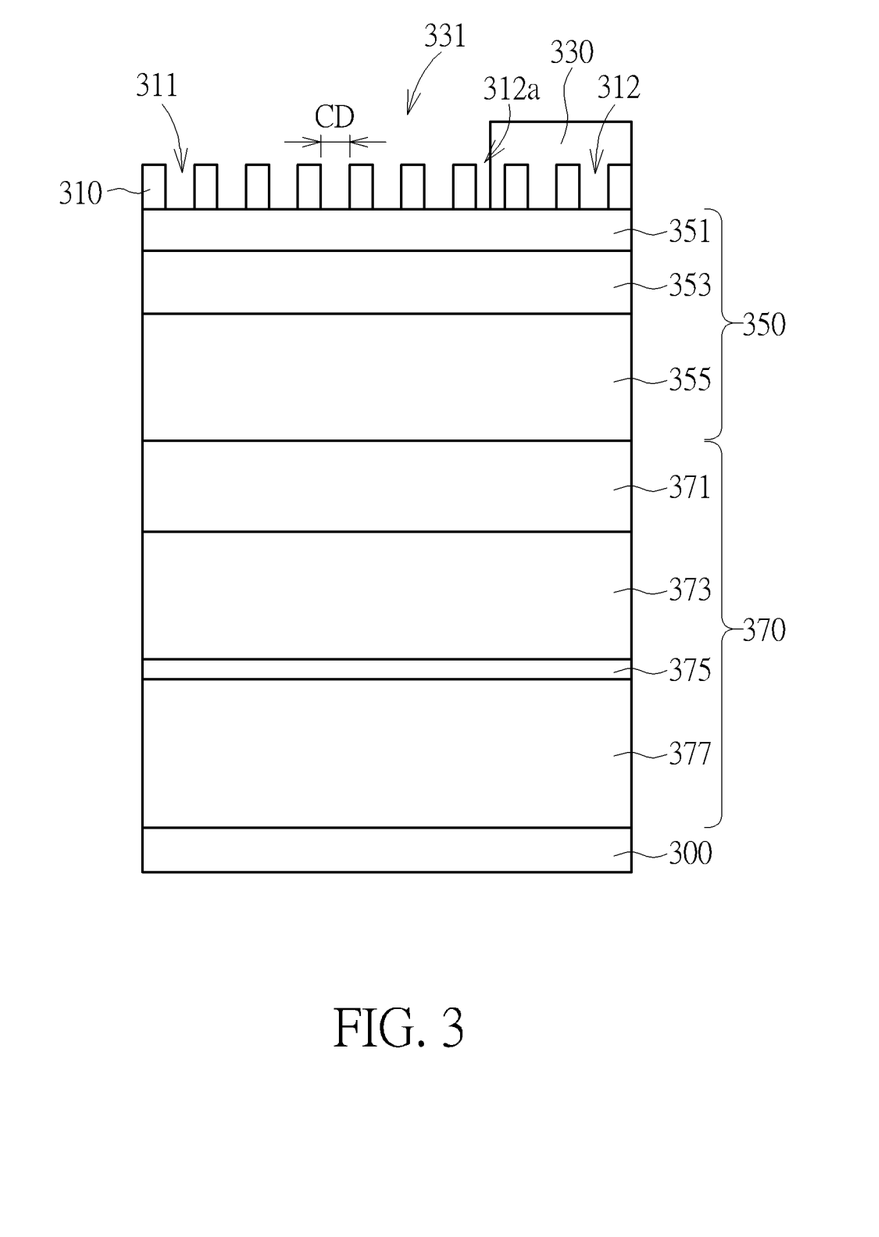
FIG. 3 shows a cross-sectional view taken along a cross line A-A' in FIG. 2.

About the layout relationship of the first opening patterns 311, the second opening patterns 312 and the third opening pattern 331, please also refer to the layout design as shown in FIG. 1. Precisely speaking, FIG. 1 shows a layout design established by an optical proximity correction (OPC) technology, and the layout design is accomplished by using a storage media (not shown in the drawings) of a computer system (not shown in the drawings) to modify the compatibility of each element pattern to form the semiconductor structure as shown in FIGS. 2-3. Through the layout design, a plurality of patterns with the same dimension CD and pitch P are firstly established to alternately and regularly arrange into an array, as shown in FIG. 1. Next, a plurality of first patterns 111 and a plurality of second patterns 121 are defined, with the second patterns 121 surrounding the first patterns 111. Also, each of the first patterns 111 and each of the second patterns 121 are regularly arranged along a direction D1 (for example the y-direction) respectively, to form a plurality of columns C11, C12, C13, C14, C15, C16, C17, C18, C19. Otherwise, each of the second patterns 121 may also be arranged independently to form a plurality of columns C21, C22 at two sides of the first patterns 111. That is, the first patterns 111 and the second patterns 121 may both perform like an array arrangement from a diagram as shown in FIG. 1, but not limited thereto. Furthermore, the first patterns 111 and the second patterns 121 arranged in each odd column C11, C13, C15, C17, C19 are in aligned arrangement with each other in another direction D2 (for example the x-direction) which is perpendicular to the direction D1, and the first patterns 111 and the second patterns 121 arranged in each even column C12, C14, C16, C18 are also in aligned arrangement with each other in the direction D2. However, the first patterns 111 and the second patterns 121 arranged in the odd columns C11, C13, C15, C17, C19 and the even columns C12, C14, C16, C18 are misaligned arrangement both in the directions D1, D2, for example with a misalignment of about a half to one third of the pitch P as shown in FIG. 1, but is not limited thereto.

The formations of the first opening patterns 311 and the second opening patterns 312 may include the following steps. Firstly, a substrate 300 is provided, and the substrate 300 may be a silicon substrate, or a dielectric layer disposed on a silicon substrate, but not limited thereto. A mask structure 350 and a stacked structure 370 are then formed on the substrate 300 sequentially from bottom to top, and the mask structure 350 and the stacked structure 370 both include a multilayer structure, as shown in FIG. 3. Then, according to the layout design as shown in FIG. 1, at least one photomask (not shown in the drawings) is used to form the first opening patterns 311 and the second opening patterns 312 in the material layer 310 on the mask layer 350. In the present embodiment, the first opening patterns 311 and the second opening patterns 312 are formed for example by using at least two photomasks (not shown in the drawings) to perform two self-aligned double patterning (SADP) processes to form a plurality of stripe-shaped patterns (not shown in the drawings) crossed with each other, followed by patterning the material layer 330 by using overlapped regions of the stripe-shaped patterns, but not limited thereto. In another embodiment, a general photo-etching process (PEP) may also be performed directly to form the opening patterns in an array arrangement at once, or a double patterning-double etching (2P2E) process may be performed to gradually form the opening patterns in an array arrangement. In this way, the first opening patterns 311 and the second opening patterns 312 formed in the material layer 310 may therefore obtain the same dimension CD, the same pitch P, and the same arrangement.

However, people skilled in the art should fully realize that, although the present embodiment is exemplified by establishing the first patterns 111 and the second patterns 121 within the same dimension, pitch and arrangement, but the practical design is not limited thereto. In a practical process, the layout design and the semiconductor process may both be further modified according to the product requirements, to make the dimension, the pitch and the arrangement of each of the second patterns 121 being different from that of each first pattern 111. That is, the first patterns and the second patterns may therefore have different dimensions, pitches and arrangements.

On the other hand, the layout design further establishes a third pattern 131. The third pattern 131 preferably covers all of the first patterns 111 and at least a portion of the second patterns 121a, so that, an edge 131a of the third pattern 131 regularly extended along the direction D1 may be located between the first patterns 111 and the second patterns 121, and another edge 131b of the third pattern 131 regularly extended along the direction D2 may be located right on the portion of the second patterns 121a, as shown in FIG. 1. In other words, the edge 131a of the third pattern 131 does not directly dispose on any one of the second patterns 121, and the another edge 131b of the third pattern 131 does dispose on the portion of the second patterns 121a, such as being located on the second patterns 121a only arranged in even columns C12, C14, C16, C18, as shown in FIG. 1. However, in another embodiment, the another edge (not shown in the drawings) may also be disposed on a portion of the second patterns 121 which is only arranged in odd columns C11, C13, C15, C17, C19, but not limited thereto. With these arrangement, an area of about a half of the dimension CD of each second pattern 121a is covered by the third pattern 131, to make another area of about a half of the dimension CD of each second pattern 121a being exposed from the third pattern 131. Following these, another photomask (not shown in the drawings) is used to perform another PEP to form the third opening pattern 331 in the blocking layer 330 disposed on the material layer 310, with the third opening pattern 331 being overlapped with all of the first opening patterns 311 and the portion of the second opening patterns 312, as shown in FIGS. 2-3. That is, the third opening pattern 331, the first opening patterns 311 and the second opening patterns 312 may have similar correspondences of the third pattern 131, the first patterns 111 and the second patterns 121 as described above including with a portion of the second opening patterns 312a and all of the first opening patterns 311 being exposed from the third opening pattern 331, as shown in FIGS. 2-3.

Figure 4:
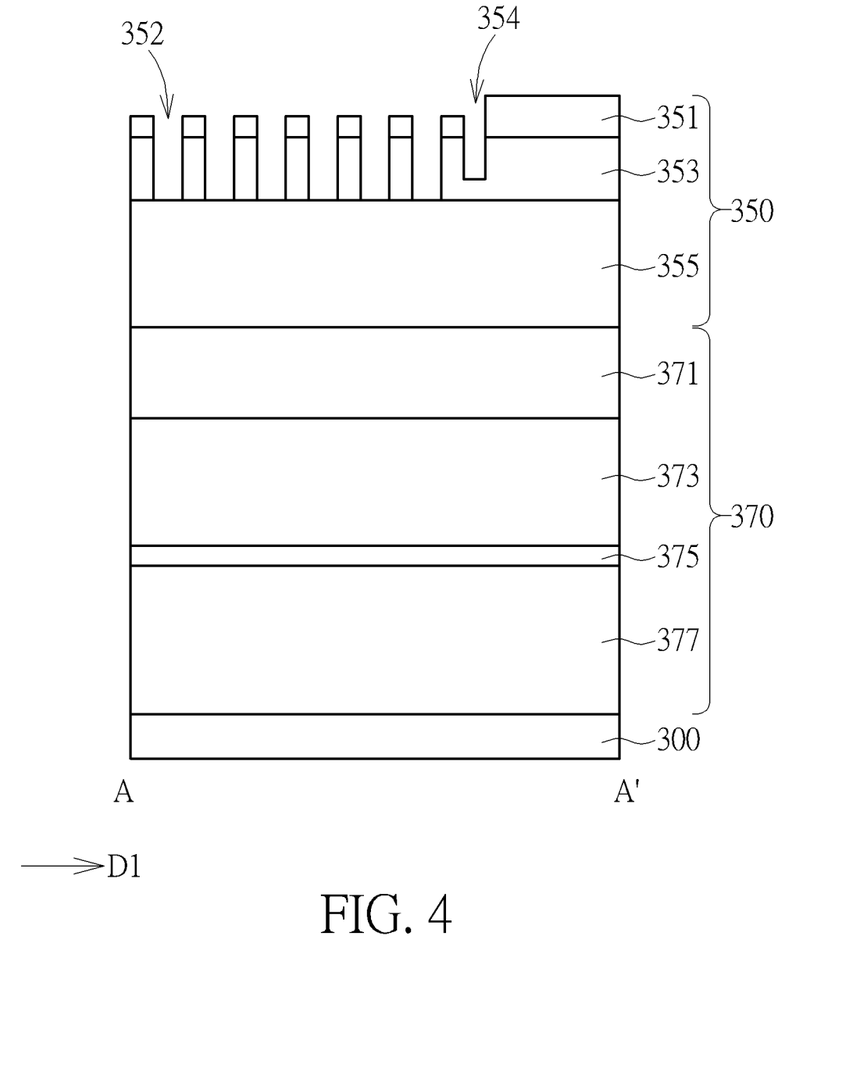
FIG. 4 shows a cross-sectional view of a semiconductor structure after forming a through opening and a non-through opening.

Next, the semiconductor structure as shown in FIGS. 2-3 is continuously used in the semiconductor process of the present embodiment, to perform an etching process to simultaneously transfer the third opening pattern 331 within the blocking layer 330, and the first opening patterns 311 and the second opening patterns 312a within the material layer 310 into the mask structure 350 underneath. In the present embodiment, the mask structure 350 includes an anti-reflection layer 351 such as an advanced patterning film (APF), a sacrificial layer 353 such as including a material like silicon dioxide ($SiO_2$), and a hard mask layer 355 such as a silicon-containing hard mask (SHB) stacked from top to bottom, and the etching process is performed by simultaneously transferring the third opening pattern 331 and the first opening patterns 311, the second opening patterns 312 into the anti-reflection layer 351 and the sacrificial layer 353 of the mask structure 350, to form a plurality of through openings 352 penetrated through the anti-reflection layer 351 and the sacrificial layer 353. Then, the blocking layer 330 and the material layer 310 disposed on the mask structure 350 are removed, as shown in FIG. 4.

It is noted that, since each of the second opening patterns 312a is only partially overlapped with the third opening pattern 331, with the rest portions of those second opening patterns 312a being covered by the blocking layer 330, each of the second opening patterns 312a may therefore obtain a relative smaller diameter than that of each first opening pattern 311 which are completely overlapped with the third opening pattern 331, for example being smaller than the dimension CD thereof. In this situation, the etchant used in the etching process may be limited by the aforementioned smaller diameter of the second opening patterns 312a, and which may not be efficiency worked while removing the anti-reflection layer 351 and the sacrificial layer 353. That is, a non-through opening 352 which is not completely penetrated through the sacrificial layer 353 is formed, as shown in FIG. 4.

After that, another etching process is performed to continuously transfer the through openings 352 and the non-through opening 354 within the anti-reflection layer 351 and the sacrificial layer 353 into the hard mask layer 355 and the stacked structure 370 underneath. In the present embodiment, the stacked structure 370 includes plural films with various materials alternately stacked on one over another, and which may include a first layer 371 for example including a material like silicon nitride (SiN), a second layer 373 including a material like silicon oxide (SiO), a third layer 375 including a material like silicon nitride, a fourth layer 377 including a material like borophosphosilicate glass (BPSG) stacked from top to bottom. The hard mask layer 355 disposed on the stacked structure 370 may include amorphous silicon (a-Si), pure silicon or polysilicon (p-Si), but not limited thereto. It is noted that, while performing the another etching process, the non-through opening 354 which are not penetrated through the anti-reflection layer 351 and the sacrificial layer 353 may not be further transferred into the hard mask layer 355 and the stacked structure 370 underneath, due to the greater etching selectivity between the materials of hard mask layer 355 and other films of the mask structure 350. Thus, the pattern of the non-through opening 354 will still remain within the anti-reflection layer 351 and the sacrificial layer 353.

Figure 5:
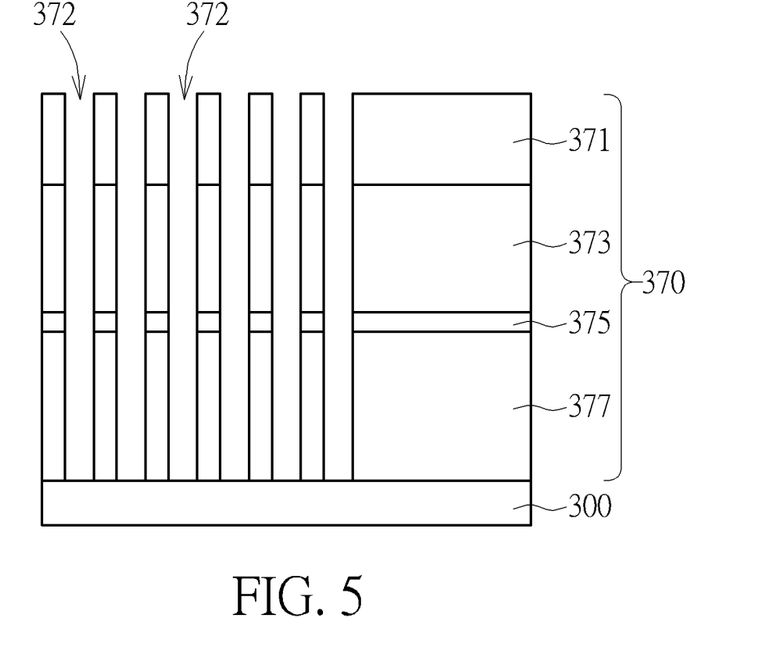
FIG. 5 shows a cross-sectional view of a semiconductor structure after forming an opening.
Figure 6:
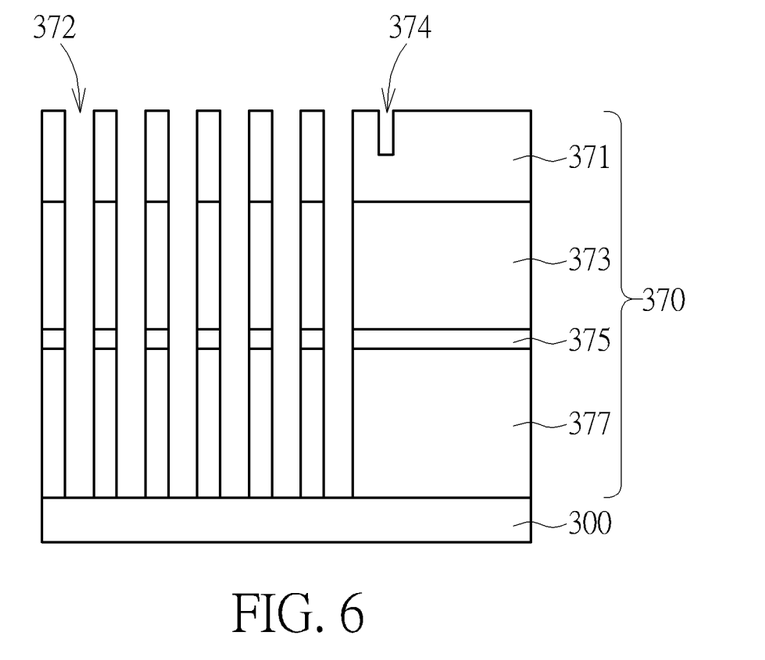
FIG. 6 shows a cross-sectional view of a semiconductor structure according to another preferred embodiment of the present invention.

On the other hand, the through openings 352 which are penetrated through the anti-reflection layer 351 and the sacrificial layer 353 are continuously transferred into the hard mask layer 355 and the stacked structure 370 to form a plurality of openings 372 in the stacked structure 370 to expose the substrate 300 underneath, as shown in FIG. 5. With such performance, if the mask structure 350 is completely removed in the subsequent process, only the openings 372 which are corresponding to the through openings 352 are remained in the stacked structure 370 without forming any corresponding pattern in accordance with the non-through opening 354 in the stacked structure 370. However, in another embodiment, the etching conditions such as the etchant or the etching time of the another etching process may also be adjusted to allow the patterns of the non-through opening 354 to be transferred into the hard mask layer 355 and a portion of the stacked structure 370 (for example the first layer 371 of the stacked structure 370). Then, after completely removing the mask structure 350, the openings 372 corresponding to the through openings 352, as well as opening 374 which is corresponding to the non-through opening 354, are both formed in the stacked structure 370, as shown in FIG. 6. The opening 374 is formed only at a top portion of the stacked structure 370 (namely, the top portion of the first layer 371) without exposing any substrate 300 underneath, and which may include a diameter relative smaller than that of the openings 372.

Through these processes, the method of forming a layout definition of a semiconductor device according to the first preferred embodiment of the present invention is accomplished. According to the method of the present embodiment, patterns of an electric circuit of the semiconductor device is firstly established on the layout design as shown in FIG. 1, through the OPC technology, to imitate the corresponding relationship between each element pattern, so as to immediately correct those element patterns and the corresponding relationship thereof. Thus, the exposure patterns obtained thereby may be able to meet the expected requirements. Then, at least one photomask is used to perform a suitable photolithography technology based on the layout design, to transfer each of the patterns 111, 121, 131 formed on the layout design into the semiconductor device according to a particular proportion, thereby forming the semiconductor structure as shown in FIGS. 2-3. In the present embodiment, each of the patterns 111, 121, 131 are corresponding to the first opening patterns 311, the second opening patterns 312 on the semiconductor device, and the third opening pattern 331 on the blocking layer 330, respectively, so that, only the first opening patterns 311 among these opening patterns are truly transferred to the subsequent formed semiconductor structure, to form the openings 372. In this way, the layout definition method of the present embodiment is sufficient to be used on the forming process of minimized elements with a finer line width and space, for avoid possible limits which are subject to optical characteristics during the exposure process.

Additionally, the layout definition method of the present embodiment may be applied to a process of a DRAM device, to form a storage node (SN) of the DRAM device. Precisely speaking, the substrate 300 of the present embodiment for example include a silicon substrate (such as a silicon containing substrate or a silicon-on insulator substrate) of the DRAM device, a plurality of buried gates (not shown in the drawings) is formed in the silicon substrate to serve as buried word lines (BWL, not shown in the drawings), and a plurality of bit lines (not shown in the drawings) and a plurality of plugs (not shown in the drawings) are formed on the silicon substrate, with the bit lines and plugs being alternately arranged on the silicon substrate to serve as the bit lines and storage node contacts (SNCs) of the DRAM device.

Then, the stacked structure 370, the mask structure 350, the material layer 310 and the blocking layer 330 are sequentially formed on the silicon substrate, and the aforementioned method of forming a layout definition of a semiconductor device is carried out by using the layout design as shown in FIG. 1 to form the first opening patterns 311 and the second opening patterns 312 in the material layer 330, and to form the third opening pattern 331 in the blocking layer 330 after the blocking layer 330 is formed. Through this performance, the openings 372 corresponding to the first opening patterns 311 are formed in the stacked structure 370, to expose each of the plugs formed over the silicon substrate respectively. That is, the openings 372 formed in the stacked structure 370 may therefore be functioned like SN fins which are required in the subsequent process of SN, and a capacitor structure may be formed in each of the openings, with the capacitor structure at least including a bottom electrode layer (not shown in the drawings), a capacitor dielectric layer (not shown in the drawings) and a top electrode layer (not shown in the drawings), forming the SNs of the DRAM device thereby. On the other hand, patterns of the portion of the second opening patterns 312a which are overlapped with the third opening pattern 331 may be optionally remained in the mask structure 350 or remained in the top portion of a top layer (namely the first layer 371) of the stacked structure 370, without forming any opening. Thus, it is sufficient to define a SN structure in a compact, highly integrated layout via the layout design of the semiconductor device, and to further define a core region and a periphery region of the semiconductor device. In this way, the method of the present embodiment may have advantages to form an improved semiconductor device under a simplified process flow.

It is noted that, the number of the stacked films of the mask structure 350 or the stacked structure 370 in the aforementioned embodiment is only designed in accordance with the process of the DRAM device and is not limited to be three or four films. In other embodiments of the present invention, the number of the stacked films, and the materials and the stacked order of the stacked films may be further adjusted according to the product requirements.

Furthermore, people skilled in the arts may fully understand that the forming method of the present invention is not limited to be achieved through the aforementioned process, and may also include other process in order to meet practical product requirements. The following description will detail the different embodiments of method of forming a layout definition of a semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
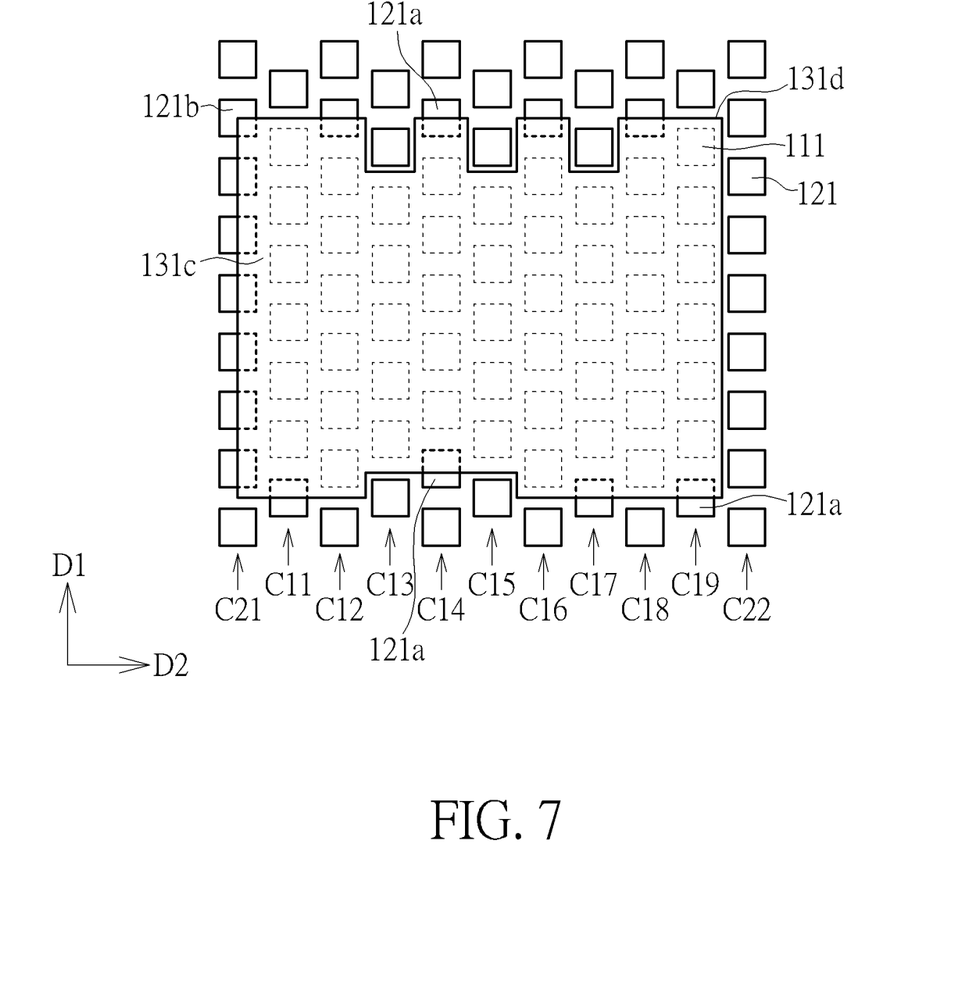
FIG. 7 show is a schematic diagram illustrating a method of forming a layout definition of a semiconductor device according to a second preferred embodiment of the present invention.

Please refer to FIG. 7, FIG. 7 illustrates a method of forming a layout definition of a semiconductor device according to the second preferred embodiment of the present invention. The formal steps in the present embodiment are similar to those in the first preferred embodiment, and which will not be redundantly described herein. The differences between the present embodiment and the aforementioned first preferred embodiment are mainly in modifying the layout design according to the element location of the practical product, to change the dimensions, the pitches or the related positions of patterns 111, 121, 131. For example, an edge 131c of the third pattern 131 along the direction D1 may be optionally located on a portion of the second patterns 121b, as shown in FIG. 7. Otherwise, an edge 131d of the third pattern 131 along the direction D2 may be optionally extended irregularly to be located on a portion of the second patterns 121a, as shown in FIG. 7. That is, the region boundary of the semiconductor structure established by the third pattern 131 may obtain more variety for further meeting the practical design requirements of each element.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a layout definition of a semiconductor device, comprising:
    establishing a plurality of first patterns to form a material layer over a substrate, the first patterns being regularly arranged in a plurality of columns along a first direction to form an array arrangement;
    establishing a plurality of second patterns surrounding the first patterns;
    establishing a third pattern to form a blocking layer on the material layer, the third pattern overlapped with a portion of the second patterns, with at least one of the second patterns being partially exposed from the third pattern;
    forming a mask structure on the stacked structure;
    using the first patterns to form a plurality of through openings in the mask structure;
    using the at least one of the second patterns to form at least one non-through opening in the mask structure; and
    using the first patterns to form a plurality of first openings in a stacked structure on the substrate to expose a portion of the substrate respectively.

2. The method of forming a layout definition of a semiconductor device according to claim 1, wherein the second patterns are in alignment with the first patterns within each of the columns.

3. The method of forming a layout definition of a semiconductor device according to claim 1, wherein the third pattern comprises a first edge extended along the first direction, and the first edge is disposed between the first patterns and the second patterns.

4. The method of forming a layout definition of a semiconductor device according to claim 1, wherein the third pattern comprises a second edge extended along a second direction being perpendicular to the first direction, and the second edge is disposed on the at least one of the second patterns.

5. The method of forming a layout definition of a semiconductor device according to claim 4, wherein the second edge is irregularly extended.

6. The method of forming a layout definition of a semiconductor device according to claim 4, wherein the second edge is regularly extended.

7. The method of forming a layout definition of a semiconductor device according to claim 6, wherein the at least one of the second patterns is disposed only in alignment with the first patterns arranged in even columns.

8. The method of forming a layout definition of a semiconductor device according to claim 6, wherein the at least one of the second patterns is disposed only in alignment with the first patterns arranged in odd columns.

9. The method of forming a layout definition of a semiconductor device according to claim 1, further comprising:
    through the at least one non-through opening in the mask structure to form at least one second opening only in a top portion of the stacked structure, without exposing the substrate.

10. The method of forming a layout definition of a semiconductor device according to claim 1, wherein each of the first patterns and each of the second patterns comprise a same dimension and a same pitch.

11. The method of forming a layout definition of a semiconductor device according to claim 1, wherein about a half of the at least one of the second pattern being exposed from the third pattern.

12. The method of forming a layout definition of a semiconductor device according to claim 1, wherein the first patterns arranged in even columns are in alignment with each other.

13. The method of forming a layout definition of a semiconductor device according to claim 1, wherein the first patterns arranged in odd columns are in alignment with each other.

14. The method of forming a layout definition of a semiconductor device according to claim 1, wherein the first patterns arranged in odd columns and even columns are in misalignment with each other.

* * * * *